United States Patent
Smith et al.

(10) Patent No.: US 10,033,410 B2
(45) Date of Patent: *Jul. 24, 2018

(54) APPARATUS AND METHOD FOR COMMUNICATING DATA OVER A COMMUNICATION CHANNEL

(71) Applicant: INPHI CORPORATION, Santa Clara, CA (US)

(72) Inventors: Benjamin Smith, Ottawa (CA); Arash Farhoodfar, Sunnyvale, CA (US); Stewart Crozier, Boulder, CO (US); Frank R. Kschischang, Mississauga (CA); Andrew Hunt, Ottawa (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/206,011

(22) Filed: Jul. 8, 2016

(65) Prior Publication Data

US 2016/0322989 A1 Nov. 3, 2016

Related U.S. Application Data

(63) Continuation of application No. 14/744,015, filed on Jun. 18, 2015, now Pat. No. 9,413,493, which is a (Continued)

(51) Int. Cl.
*H04L 25/34* (2006.01)
*H03M 13/29* (2006.01)
(Continued)

(52) U.S. Cl.
CPC ... *H03M 13/2906* (2013.01); *H03M 13/1515* (2013.01); *H04L 1/006* (2013.01);
(Continued)

(58) Field of Classification Search
CPC .......... H03M 13/2906; H03M 13/1515; H04L 1/0041; H04L 1/0045; H04L 1/0065;
(Continued)

(56) References Cited

U.S. PATENT DOCUMENTS 6,374,382 B1 4/2002 Solomon et al.
9,083,492 B2 * 7/2015 Smith .................. H04L 1/0042
(Continued)

OTHER PUBLICATIONS

Wachsmann, Udo et al., "Multilevel Codes: Theoretical Concepts and Practical Design Rules", IEEE Transactions on Information Theory, vol. 45, No. 5, Jul. 1999, 1361-1391.
(Continued)

*Primary Examiner* — Dhaval Patel
(74) *Attorney, Agent, or Firm* — Richard T. Ogawa; Ogawa P.C.

(57) ABSTRACT

For some applications such as high-speed communication over short-reach links, the complexity and associated high latency provided by existing modulators may be unsuitable. According to an aspect, the present disclosure provides a modulator that can reduce latency for applications such as 40G/100G communication over copper cables or SMF. The modulator has a symbol mapper for mapping a bit stream into symbols, and a multi-level encoder including an inner encoder and an outer encoder for encoding only a portion of the bit stream. In some implementations, the multi-level encoder is configured such that an information block size of the inner encoder is small and matches a field size of the outer encoder. Therefore, components that would be used to accommodate larger block sizes can be omitted. The effect is that complexity and latency can be reduced. According to another aspect, the present disclosure provides a demodulator that is complementary to the modulator.

18 Claims, 4 Drawing Sheets

Related U.S. Application Data continuation of application No. 14/180,315, filed on Feb. 13, 2014, now Pat. No. 9,083,492.

(60) Provisional application No. 61/765,050, filed on Feb. 15, 2013.

(51) Int. Cl.
*H04L 1/00* (2006.01)
*H04L 25/49* (2006.01)
*H04L 27/04* (2006.01)
*H03M 13/15* (2006.01)

(52) U.S. Cl.
CPC .......... *H04L 1/0041* (2013.01); *H04L 1/0042* (2013.01); *H04L 1/0045* (2013.01); *H04L 1/0057* (2013.01); *H04L 1/0063* (2013.01); *H04L 1/0065* (2013.01); *H04L 25/4917* (2013.01); *H04L 27/04* (2013.01)

(58) Field of Classification Search
CPC ... H04L 25/4917; H04L 1/0063; H04L 27/04; H04L 1/0057; H04L 1/006; H04L 1/0042
See application file for complete search history.

(56) References Cited

U.S. PATENT DOCUMENTS

| | | | |
|---|---|---|---|
| 9,413,493 B2* | 8/2016 | Smith | .................. H04L 1/0042 |
| 2005/0102605 A1 | 5/2005 | Gupta | |
| 2005/0135298 A1 | 6/2005 | Wei et al. | |
| 2008/0225819 A1 | 9/2008 | Niu et al. | |
| 2008/0267122 A1 | 10/2008 | Han et al. | |
| 2009/0031201 A1 | 1/2009 | Das et al. | |
| 2011/0173517 A1 | 7/2011 | Kim | |
| 2011/0231728 A1 | 9/2011 | Gaur | |
| 2014/0153672 A1 | 6/2014 | Zhao et al. | |
| 2014/0233673 A1 | 8/2014 | Smith et al. | |

OTHER PUBLICATIONS

International Search Report and Written Opinion for PCT Patent Application No. PCT/US14/16329 dated Jun. 13, 2014, 28 pages.

\* cited by examiner

APPARATUS AND METHOD FOR COMMUNICATING DATA OVER A COMMUNICATION CHANNEL

RELATED APPLICATION

This application is a continuation of U.S. patent application Ser. No. 14/744,015 filed on Jun. 18, 2015, which in turn is a continuation of U.S. patent application Ser. No. 14/180,315 filed on Feb. 13, 2014. This application claims priority from U.S. Provisional Patent Application No. 61/765,050 filed on Feb. 15, 2013. The aforementioned applications are incorporated by reference in their entirety.

FIELD OF THE DISCLOSURE

The disclosure relates to communication systems, and more particularly to communicating data over a communication channel.

BACKGROUND

A transmitter can transmit a signal to a receiver over a communication channel. The signal can encode various data. If the communication channel is not perfect, then the signal received by the receiver may not be identical to the signal transited by the transmitter. For instance, the communication channel may have introduced noise into the signal. If the signal received by the receiver is distorted enough by the communication channel, then the data may not be recoverable by the receiver.

BRIEF DESCRIPTION OF THE DRAWINGS

Embodiments of the disclosure will now be described with reference to the attached drawings in which.

DETAILED DESCRIPTION OF EMBODIMENTS

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

For some applications such as high-speed communication over short-reach links, the complexity and associated high latency provided by existing modulators may be unsuitable. According to an aspect, the present disclosure provides a modulator that can reduce latency for applications such as 40G/100G communication over copper cables or SMF (single-mode fiber). The modulator has a symbol mapper for mapping a bit stream into symbols, and a multi-level encoder including an inner encoder and an outer encoder for encoding only a portion of the bit stream. In some implementations, the multi-level encoder is configured such that an information block size of the inner encoder is small and matches a field size of the outer encoder. Therefore, components that would be used to accommodate larger block sizes can be omitted. The effect is that complexity and latency can be reduced. According to another aspect, the present disclosure provides a demodulator that is complementary to the modulator.

Other aspects and features of the present disclosure will become apparent, to those ordinarily skilled in the art, upon review of the following description of the specific embodiments of the invention.

Introduction

If a signal received by a receiver is distorted enough by a communication channel, then data sent with the signal may not be recoverable by the receiver. FEC (forward error correction) or channel coding is a technique that involves encoding a signal in a redundant manner so that data sent with the signal may be recoverable even if there are errors in transmission. Such techniques may be employed when it is difficult or impractical to support re-transmission of data following an error. Example encoders are described below with reference to FIGS. 1 and 2.

Figure 1:
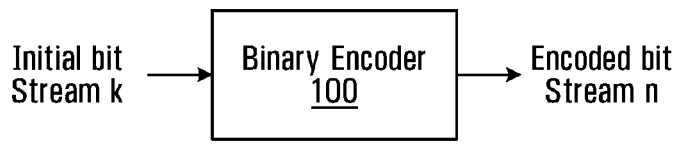
FIG. 1 is a block diagram of a binary encoder.

Referring first to FIG. 1, shown is a block diagram of a binary encoder 100. The binary encoder 100 is capable of encoding an initial bit stream k into an encoded bit stream n, where n is an integer multiple of k. For example, if the integer multiple is three (i.e. rate=⅓) and the initial bit stream is "01", then the encoded bit stream would be "010101". Note that if any one bit of the encoded bit stream is changed during transmission (e.g. due to a noisy communication channel), then it may still be possible to recover the initial bit stream because there would be two recovered copies of the initial bit stream against one bad copy of the initial bit stream.

The binary encoder 100 allows for adequate FEC capabilities. However, the binary encoder 100 is not very efficient at utilizing bandwidth of a communication channel. In the foregoing example with the rate=⅓, it can be seen that two-thirds of the bits transmitted over the communication channel are redundant. Reducing the rate to ½ reduces the amount of redundant bits, but if any one bit of the encoded bit stream is changed during transmission, then it may not be possible to recover the initial bit stream because there would be only one recovered copy of the initial bit stream against one bad copy of the initial bit stream and the receiver may not know which is the recovered copy.

The binary encoder 100 is rather rudimentary because the encoded bit stream n is merely made up of exact copies of the initial bit stream k. If the encoded bit stream n is transmitted over a communication channel that tends to cause an error for a certain bit pattern, then the redundancy provided by the encoded bit stream n may be inadequate (i.e. the same error may affect all copies of the initial bit stream k). In such scenarios, increasing redundancy provided by the binary encoder 100 may not help.

Figure 2:
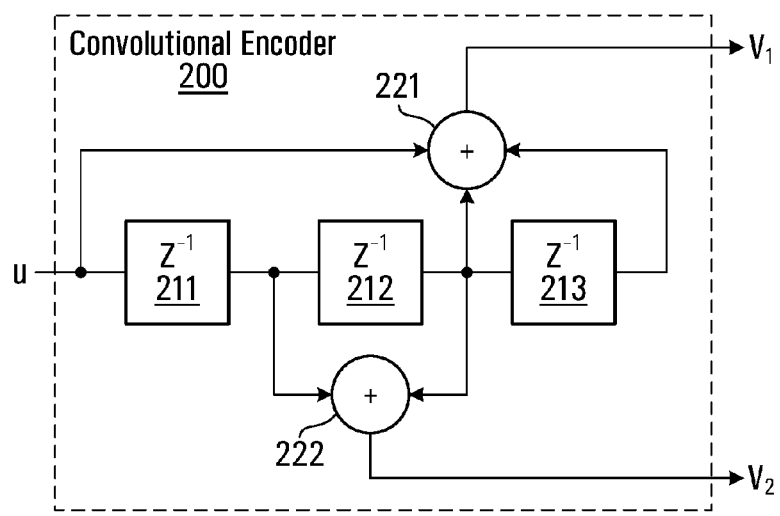
FIG. 2 is a block diagram of a convolutional encoder.

Referring now to FIG. 2, shown is a block diagram of a convolutional encoder 200, which may provide improved redundancy compared to the binary encoder 100 shown in FIG. 1. The convolutional encoder 200 includes various delay elements 211,212,213 and various summation elements 221,222. The number of delay elements 211,212,213 and the connections with the summation elements 221,222 determine how outputs $V_1$ and $V_2$ are derived from an input u. In the illustrated example, the outputs $V_1$ and $V_2$ are provided by equations 1 and 2 below.

$$V_1 = u[n] + u[n-2] + u[n-3] \quad [1]$$

$$V_2 = u[n-1] + u[n-2] \quad [2]$$

Of course different delay elements 211,212,213 and different connections with the summation elements 221,222 would provide different outputs $V_1$ and $V_2$.

In the illustrated example, the convolutional encoder 200 has a rate of ½ because there are two outputs $V_1$ and $V_2$ for one input u. Other rates are possible for example by increasing the number of outputs. In contrast with the binary encoder 100 shown in FIG. 1, the outputs $V_1$ and $V_2$ may be quite different from one another. Thus, if a communication channel tends to cause an error for a certain bit pattern found in one output, this may not affect the other output if it does not have that bit pattern. In this regard, the outputs $V_1$ and $V_2$ may be specifically designed so that they are quite different from one another. Note that if the outputs $V_1$ and $V_2$ are designed to be identical to one another, then the convolutional encoder 200 may not provide improved redundancy over the binary encoder 100 shown in FIG. 1.

The binary encoder 100 shown in FIG. 1 and the convolutional encoder 200 shown in FIG. 2 may be used to encode all bits of a bit stream. However, the amount of redundancy involved in encoding all bits of a bit stream can be expensive from a bandwidth perspective. For example, when encoding all bits with a rate=⅓, two-thirds of the bits transmitted over a communication channel are redundant and thus represent a considerable amount of overhead that consumes bandwidth. Greater transmission rates may be achievable if the amount of overhead can be reduced. This can be accomplished by selectively encoding a portion of a bit stream.

Trellis-Coded Modulator

Figure 3:
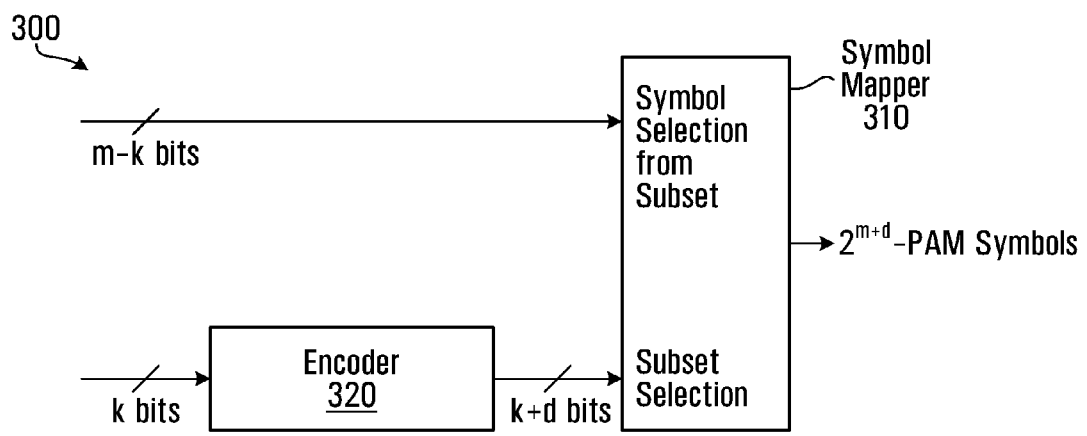
FIG. 3 is a block diagram of a TCM (trellis-coded modulator) featuring an encoder that encodes only a portion of a bit stream.

Referring now to FIG. 3, shown is a block diagram of trellis-coded modulator 300 featuring an encoder 320 that encodes only a portion of a bit stream. In particular, the encoder 320 encodes k bits while a remaining m−k bits may not be encoded. The choice of which bits to encode is implementation specific, but generally involves encoding bits for which errors may make it difficult or impossible to recover data. In the illustrated example, the encoded bits k+d are used to select a subset of symbols while the remaining m−k bits are used to select a symbol from the subset of symbols. There are $2^{m+d}$ PAM (Pulse Amplitude Modulation) symbols in the constellation. A signal mapper 310 maps information bits and convolutionally encoded bits to a constellation point.

Figure 4:
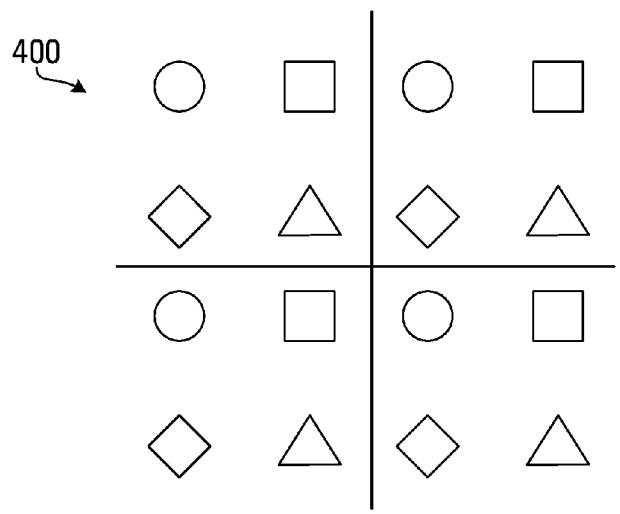
FIG. 4 is a constellation diagram representing a set of example symbols for the trellis-coded modulator shown in FIG. 3.

Referring now to FIG. 4, shown is a constellation diagram 400 representing a set of example symbols for the trellis-coded modulator shown in FIG. 3. Note that the constellation diagram 400 and its example symbols are provided merely for explanatory purposes. The constellation diagram 400 includes four classes of symbols represented by four shapes: circle, square, diamond, and triangle. The encoded bits k+d can be used to select one class of symbols, for example the class of symbols represented by the diamond. Note that all symbols of a class are separated from one another in Euclidean space. Thus, once a class of symbols is selected, the remaining m−k bits can be used to select the symbol of that class. When and if there is any error in transmission for the remaining m−k bits, it may still be possible to decipher which symbol of that class was transmitted, as other symbols of that class are far away in a Euclidean sense.

The encoder 320 of the trellis-coded modulator 300 shown in FIG. 3 might for example be a convolutional encoder that encodes k bits into k+1 bits thereby achieving a rate=k/(k+1). Such rate can enable efficient decoding by a receiver using a soft-decision Viterbi decoder. However, other rates are possible and are implementation-specific. In other implementations, the encoder 320 includes multiple levels for multi-level (and/or multi-phase) modulation. Thus, the trellis-coded modulator 300 can combine binary error-correcting codes with multi-level (and/or multi-phase) modulation. This can help to reliably communicate at high spectral-efficiencies. Example details of the encoder 320 including multiple levels are provided below. Note that for such implementations, the encoder 320 may have a different rate than k/(k+1).

Figure 5:
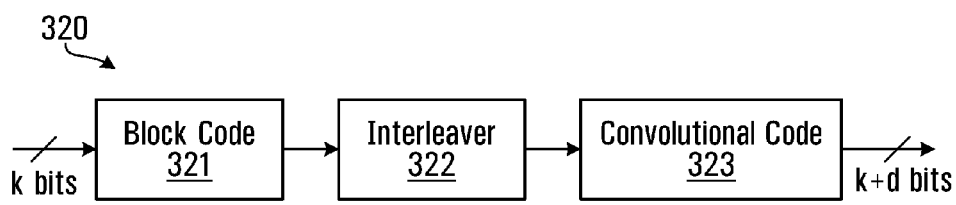
FIG. 5 is a block diagram of the encoder shown in FIG. 3.

Referring now to FIG. 5, shown is a block diagram of the encoder 320 shown in FIG. 3. The encoder 320 has two levels including a block code 321 and a convolutional code 323. The encoder 320 also has an interleaver 322, which will be described later. In operation, the block code 321 performs coding on an input sequence of k bits. The block code 321 might for example generate a 200-bit sequence from a 100-bit sequence by creating redundancy in a similar manner as in the binary encoder 100 shown in FIG. 1. The convolutional code 323 operates to further code such redundancy. The combination of the block code 321 and the convolutional code 323 can help to reliably communicate symbols at high spectral-efficiencies.

When each symbol transmitted by the trellis-coded modulator 300 is received at a receiver (not shown), the symbol may be demapped and decoded in a manner that is complementary to the trellis-coded modulator 300. In this regard, the receiver may include a demapper for demapping the symbols, a deconvolution block for decoding the bits that have been encoded using the convolutional code 323, and another decoder block for decoding the bits that have been encoded using the block code 321. The manner in which this is accomplished is implementation-specific.

If there is an error during transmission, then the deconvolution block may perpetuate such error from one bit to other neighbouring bits. This is a by-product of the nature of convolution and deconvolution. If many errors exist for one outer codeword (i.e. codeword from an outer encoder), then it may not be possible to recover that outer codeword. In order to address this issue, the trellis-coded modulator 300 and its corresponding receiver are designed to spread out the errors over many outer codewords so that ideally no single outer codeword contains more errors than can be corrected. This is made possible by the interleaver 322, which loads many outer codewords into memory, interleaves the outer codewords, and outputs interleaved outer codewords.

Example operation of the interleaver 322 will be depicted with example original outer codewords show in Table 1 and interleaved outer codewords shown in Table 2.

TABLE 1

Example Input to Interleaver 322

| Original Outer Codeword | Bits |
|---|---|
| 1 | $u_1, u_2, u_3, \ldots, u_{1000}$ |
| 2 | $u_1, u_2, u_3, \ldots, u_{1000}$ |
| 3 | $u_1, u_2, u_3, \ldots, u_{1000}$ |
| ... | ... |
| 1000 | $u_1, u_2, u_3, \ldots, u_{1000}$ |

The interleaver 322 creates an interleaved codeword using the first bit of each original codeword, and repeats for the remaining bits.

TABLE 2

Example Output from Interleaver 322

| Interleaved Outer Codeword | Bits |
|---|---|
| 1 | $u_1, u_1, u_1, \ldots, u_1$ |
| 2 | $u_2, u_2, u_2, \ldots, u_2$ |
| 3 | $u_3, u_3, u_3, \ldots, u_3$ |
| ... | ... |
| 1000 | $u_{1000}, u_{1000}, u_{1000}, \ldots, u_{1000}$ |

When an error in transmission affects an interleaved outer codeword, the result is that the error may affect multiple original outer codewords being recovered. However, since the errors are spread out over many original outer codewords being recovered, it may still be possible to recover all original outer codewords. Therefore, the interleaver 322 plays a useful role in increasing the robustness of the trellis-coded modulator 300.

However, since the interleaver 322 loads many original outer codewords into memory before it can generate the interleaved outer codewords, the interleaver 322 introduces significant latency. Also, since the receiver would implement a de-interleaver that loads many interleaved outer codewords before it can try to recover the original outer codewords, the de-interleaver also introduces significant latency. Such latencies may be tolerable for some applications, but for some applications they are not. For instance, for high-speed 40G/100G communication over SMF, the significant latencies introduced by the interleaver 322 and the complementary de-interleaver are generally considered to be poor or impractical. Simply removing the interleaver 322 and the complementary de-interleaver may reduce the robustness of the trellis-coded modulator 300 and the receiver and therefore may not be a practical solution.

Multi-Level Modulator

Figure 6:
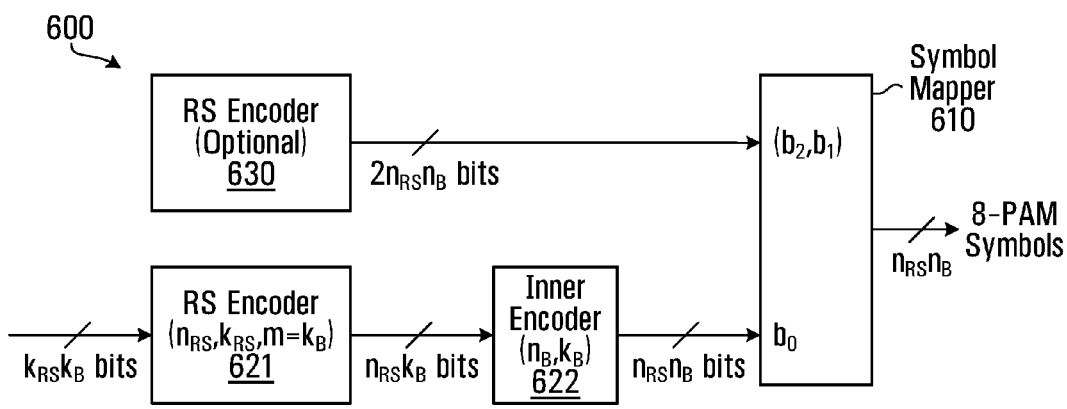
FIG. 6 is a block diagram of a multi-level modulator in accordance with an embodiment of the disclosure.
Figure 7:
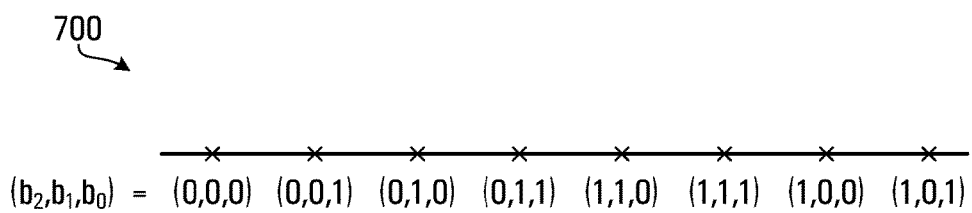
FIG. 7 is a constellation diagram representing a set of example symbols for the multi-level modulator shown in FIG. 6.

Referring now to FIG. 6, shown is a block diagram of a multi-level modulator 600, which can allow for lower latencies compared to the trellis-coded modulator 300 shown in FIG. 5. The multi-level modulator 600 has a symbol mapper 610 for mapping a three-bit sequence ($b_2, b_1, b_0$) into 8-PAM symbols. A constellation diagram representing a set of example symbols for the multi-level modulator 600 is shown in FIG. 7. Note that the LSB (Least Significant Bit) of the symbols are gray coded (i.e. they alternate 0, 1, 0, 1, etc.). Given knowledge of $b_0$, the induced sub-constellation is a uniformly-spaced 4-PAM (this is the set-partitioning element). This means that the LSB can be used to select a class of symbols (i.e. class having LSB=0 or class having LSB=1) with each symbol of that class being separated from one another (i.e. not neighbouring).

Therefore, with reference back to FIG. 6, the LSB sequence is encoded by multiple levels including an outer encoder 621 and an inner encoder 622 so that the LSB sequence may be recoverable by a receiver (not shown) in the event of transmission errors. The outer encoder 621 might for example be an RS (Reed-Solomon) encoder 621 as shown, or some other encoder such as a BCH (Bose Ray-Chaudhuri Hocquenghem) encoder or other algebraic code. The RS encoder 621 encodes $k_{RS} \cdot k_B$ bits into $n_{RS} \cdot k_B$ bits, where $n_{RS} > k_{RS}$. The inner encoder 622 might for example be a block code as apposed to a convolutional code. The inner encoder 622 encodes $n_{RS} \cdot k_B$ bits into $n_{RS} \cdot n_B$ bits, where $n_B > k_B$. The multi-level modulator 600 uses the constellation having mixed gray/set-partitioned labelling shown in FIG. 7 such that the multi-level modulator 600 can be considered to apply BICM (bit-interleaved coded-modulation) on the gray-labelled bits and MLC (multi-level-coding) on the set-partitioned bits. The output of the inner encoder 622 is applied to the gray-labelled bits, while the set-partition-labelled bits are uncoded or protected by a high-rate code.

In accordance with an embodiment of the disclosure, for the inner encoder 622, short codes with efficient trellis representations (e.g. single-parity-check, Hamming, and extended-Hamming codes) are used. An advantage of using short codes (instead of using a convolutional code as in the TCM 300 depicted by FIGS. 3 and 5) arises from their short and terminated trellises, which can reduce the complexity of hardware implementations of encoding at the transmitter and decoding at the receiver (not shown). In particular, if the information block size $k_B$ of the inner encoder 622 is chosen to match the field size m of the outer encoder 621, then an interleaver between the inner encoder 622 and the outer encoder 621 can be omitted because any errors would be confined to symbol boundaries.

The inner encoder 622 is positioned between the outer encoder 621 and the symbol mapper 610. Concatenation of multiple codes is a technique to construct a powerful code from simple components, while maintaining a relatively simple decoder. Furthermore, it allows codes with complementary properties to be combined into a single code. For example, the inner code is typically a code with an efficient soft-decision decoder, whereas the outer code is a code with an efficient hard-decision decoder. In the language of the previous paragraph, the inner code is said to have an efficient trellis representation, which implies an efficient soft-decision decoder.

In comparison with the trellis-coded modulator 300 depicted by FIGS. 3 and 5, the multi-level modulator 600 shown in FIG. 6 replaces the encoder 320 including the convolutional code 323 and the interleaver 322 with the inner encoder 622 (e.g. block code) concatenated with the outer encoder 621. Note that interleaving is not required for the multi-level modulator 600 because any errors would be confined to symbol boundaries. However, in alternative implementations, the information block size $k_B$ of the inner encoder 622 is some small multiple (e.g. exactly two) of the field size m and thus there could be interleaving over this multiple of codewords to deal with the fact that errors would no longer be confined to symbol boundaries. However, such alternative implementations might provide poorer performance than if the information block size $k_B$ of the inner encoder 622 is chosen to match the field size m of the outer encoder 621.

Various examples described herein refer to an "LSB sequence", which is a term used to describe a sequence of bits where each bit is an LSB (i.e. $b_0$) of a set of bits (e.g. ($b_2, b_1, b_0$) for 8-PAM) that are mapped to a symbol. Thus, if an LSB sequence has 100 bits for example, the LSB sequence may be used to map 100 symbols. Typically a single LSB is used to select a class of symbols. However, in another embodiment, more than one bit could be used for this purpose. Thus, an "LSB sequence" could alternatively be a sequence of bits where each bit is a lower-significance subset (e.g. $b_0$ or $b_1$) of a set of bits (e.g. ($b_2$, $b_1$, $b_0$) for 8-PAM) that are mapped to a symbol.

According to the multi-level modulator 600 shown in FIG. 6, the outer encoder 621 and the inner encoder 622 encode only a portion of the bit stream, namely an LSB sequence. However, it is to be understood that other implementations are possible and are within the scope of this disclosure. For instance, in another implementation, the outer encoder 621 and the inner encoder 622 encode some other portion of the bit stream. Such other portion may include a non LSB sequence and/or an MSB (Most Significant Bit) sequence. In an alternative implementation, the outer encoder 621 and the inner encoder 622 encode the entire bit stream (i.e. not just a portion of the bit stream).

Note that defining the constellation with 8-PAM symbols is implementation-specific. In other implementations, 4-PAM symbols are used. In other implementations, 16-PAM symbols are used. More generally, any suitable constellation with $2^N$-PAM symbols may be employed. For $2^N$-PAM, each of the $n_{RS} \cdot n_B$ bits of the LSB sequence maps to the least significant bit (i.e. $b_0$) in the label of a $2^N$-PAM symbol, with the overall label being ($b_0$, $b_1$, ..., $b_{N-1}$). A corresponding stream of $(N-1) \cdot n_{RS} \cdot n_B$ most significant bits, mapped to ($b_1$, $b_2$, ..., $b_{N-1}$), are optionally encoded by the RS encoder 630. Note that the size of the constellation may be unrelated to the length of the block code. For instance, according to some implementations, only the LSB of the constellation (assuming PAM modulation) is encoded by an inner/outer encoder, regardless of the number of points in the constellation.

The non-LSB sequences may be encoded by a separate encoder 630, but this is completely optional because it may be easy for the receiver to decipher which symbol has been transmitted even when there are errors during transmission. This is because all symbols of a class selected by the LSB are separated from one another. The separate encoder 630 might for example be an RS encoder 630 as depicted, or some other encoder such as BCH encoder.

The multi-level modulator 600 is shown with two levels of encoding (i.e. the inner encoder 622 and the outer encoder 621). However, in alternative implementations, there are three or more levels of encoding. For example, a two-dimensional outer code could be used, where "codewords" are 2-D arrays of m-bit symbols, each row and column of the array being a valid codeword of an RS code. The two-dimensional codes may be referred to as "Product Codes", and could be considered to be a two-level outer encoding. However, such alternative implementations with three or more levels of encoding might provide higher latency than two levels of encoding. More generally, the multi-level modulator 600 has at least two levels of encoding.

The multi-level modulator 600 can provide advantages with respect to latency and hardware complexity, which are two of the main challenges in designing FEC schemes for high-speed short-reach links. For instance, since the multi-level modulator 600 operates to confine errors to symbol boundaries with short codes, interleaving can be omitted thereby reducing hardware complexity and allowing lower latencies.

Note that the latencies can be designed. For example, by fixing the choice of the inner block code and the overall spectral efficiency, a range of latencies can be obtained by varying the ($n_{RS}$, $k_{RS}=n_{RS}-2t_{RS}$) of the RS encoder 621, where $t_{RS}$ is a maximum number of m-bit RS symbols that can have error. In each case, the field size is $m=k_B$, and thus a single RS decoder can be designed (for the maximum $t_{RS}$) that can be used for the entire range of latencies. For the specific case of a target spectral efficiency of 2.60 bits/symbol and a ($n_B=16$, $k_B=11$) extended-Hamming inner code, Table 3 gives the parameters of the RS encoder 621 for a range of latencies. Note that in each case, the field size of the RS encoder 621 is $m=11$.

TABLE 3

Example Parameters for RS Encoder 621

| $n_{RS}$ | $k_{RS}$ | $t_{RS}$ |
|---|---|---|
| 157 | 137 | 10 |
| 236 | 206 | 15 |
| 314 | 274 | 20 |
| 393 | 343 | 25 |
| 471 | 411 | 30 |
| 550 | 380 | 35 |
| 629 | 549 | 40 |

Figure 8:
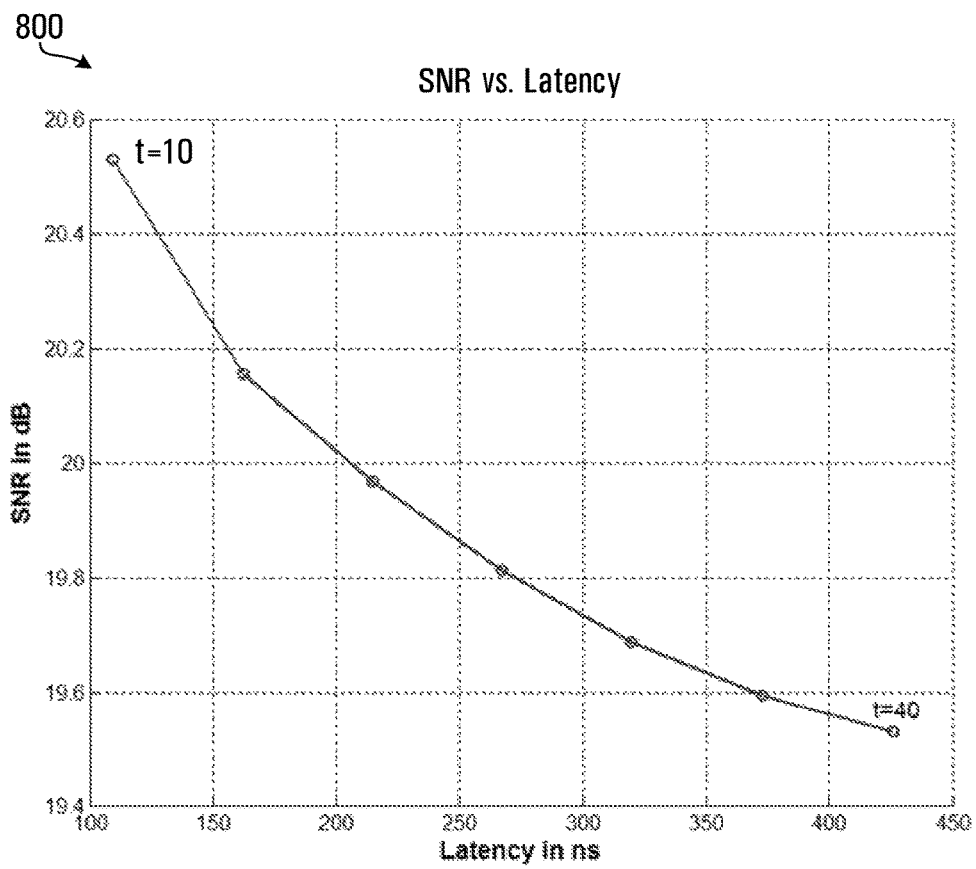
FIG. 8 is a graph depicting SNR (Signal to Noise Ratio) vs. Latency for the multi-level modulator shown in FIG. 6.

Referring now to FIG. 8, shown is a graph 800 depicting SNR (Signal to Noise Ratio) vs. latency for the multi-level modulator 600 with the foregoing parameters on an additive white Gaussian noise channel. Note that lower latencies are achieved with small code blocks (i.e. small $n_{RS}$ and $k_{RS}$), but at the same time this reduces the maximum number of m-bit RS symbols that can have error (i.e. $t_{RS}$). The graph 800 suggests that higher SNR can allow for lower latencies. Higher SNR may be achieved for example by increasing power of transmission, which may reduce power efficiency. Therefore, the precise configuration of the multi-level modulator 600 is implementation-specific and may depend on various tradeoffs (e.g. latency vs. SNR).

It is to be understood that the field size of the outer encoder 621 being $m=11$ is very specific for exemplary purposes only. Other field sizes are possible and are within the scope of this disclosure. For example, in other implementations, the field size of the outer encoder 621 is $m=9$. Such implementations may for example use 5 parity bits (e.g. 14 bits total), or some other number of parity bits. The information block size of the inner encoder 622 may be $k_B=9$ in the event that it is chosen to match the field size m of the outer encoder 621. In some implementations, the field size of the outer encoder 621 is M≥9, and the information block size of the inner encoder 622 is the same in the event that it is chosen to match the field size m of the outer encoder 621. Other implementations are possible.

The precise configuration of the multi-level modulator 600 would normally be static based on a hardware configuration of the multi-level modulator 600. However, in alternative implementations, the precise configuration of the multi-level modulator 600 can be dynamically changed. Dynamically changing the multi-level modulator 600 could for example allow the multi-level modulator 600 to accommodate for different latencies under different operating environments, etc.

Another Multi-Level Modulator

Figure 9:
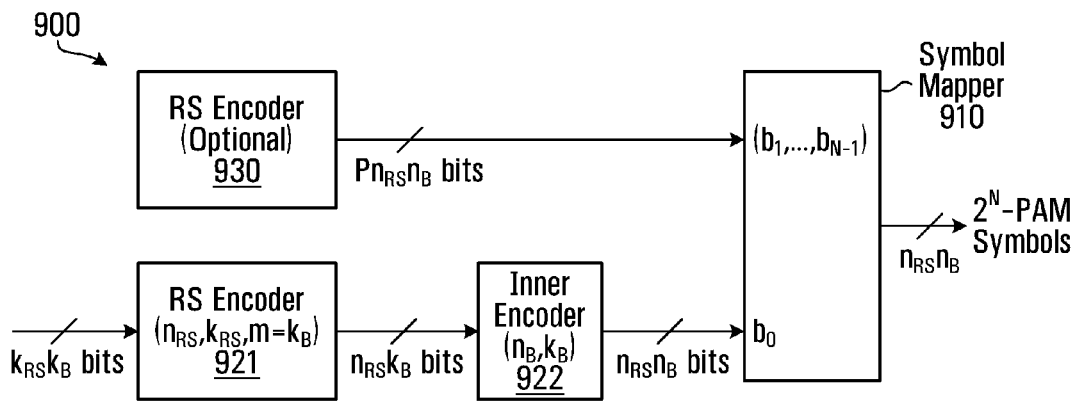
FIG. 9 is a block diagram of another multi-level modulator in accordance with an embodiment of the disclosure.

Referring now to FIG. 9, shown is a block diagram of another multi-level modulator 900. The multi-level modulator 900 has a symbol mapper 910 for mapping an N-bit ($b_0$, $b_1$, ..., $b_{N-1}$) stream into $2^N$-PAM symbols. The N-bit stream includes an LSB sequence of $n_{RS} \cdot n_B$ bits encoded by a serial concatenation of an outer encoder 921 and an inner encoder 922 as similarly described for the multi-level modulator 600 shown in FIG. 6. In some implementations, the field size of the outer code matches the information block size of the inner code, as similarly described with reference to FIG. 6.

However, in contrast with the multi-level modulator 600 shown in FIG. 6, "N" is an integer that may vary from symbol to symbol. For example, the first bit in the LSB encoded stream might map to the LSB in the label of an 8-PAM symbol, the second bit in the LSB encoded stream might map to the LSB in the label of a 4-PAM symbol, the third bit in the LSB encoded stream might map to the LSB in the label of a 2-PAM symbol, etc. According to this example, for each symbol mapped by the symbol mapper 910, N can be 1, 2 or 3. Note that there may be sequential symbols of the same constellation despite "N" being a variable. Thus, "N" may be the same value for some sequential symbols, but change for other sequential symbols.

For each $2^N$-PAM symbol in the stream, the non-LSB bits are obtained from a common stream of $p \cdot n_{RS} \cdot n_B$ bits, which are optionally encoded by an RS encoder 930. Note that "p" is an average number of bits per LSB and is not necessarily an integer. For example, if half of the symbols are 4-PAM and the other half are 8-PAM, then p=(1+2)/2=1.5. The number of bits per LSB varies with N. In some implementations, the choice of N depends on a "bit-loading" algorithm, which selects N based on one or more criteria that may depend on modulation used.

The "variable" $2^N$-PAM modulation described with reference to FIG. 9 may be utilized with DMT modulation, which is also known as OFDM (Orthogonal Frequency Division Multiplexing) modulation. In DMT, inherent frequency division multiplexing dictates that different symbols are transmitted over different frequency bands. Note that each frequency band has its own signal-to-noise ratio, and higher signal-to-noise ratios imply larger capacity for communication. The task of the bit-loading algorithm is to select N as a function of the signal-to-noise ratio of the corresponding frequency band.

More specifically, in DMT, a frequency band is divided into M sub-channels. To achieve a desired rate of communication, L bits of information are transmitted per DMT symbol. A DMT symbol is effectively M PAM-N sub symbols, where $N_i$, i in [1,M], is chosen by the bit-loading algorithm. In order to transmit L bits of information, the bit-loading algorithm is constrained to find the $N_i$ that result in a target value of "p" (the average number of bits per LSB), where this value is a function of the rates of the codes applied to the LSB and non-LSB sequences.

Note that a DMT transmitter does not actually sequentially transmit varying $2^N$-PAM symbols sequentially in time over a communication channel. Rather, it actually takes an IDFT (Inverse Discrete Fourier Transform) of the sequence of $2^N$-PAM symbols, and then transmits this resulting waveform over the communication channel. In doing so, it is doing frequency division multiplexing of many sub-channels, each sub-channel communicating a $2^N$-PAM modulation.

It is to be understood that the mapping of encoded bits to a "variable" $2^N$-PAM modulation is not specific to DMT, although DMT is an application where this may be useful. Note that the encoding of the LSB sequence may occur regardless of modulation utilised (e.g. $2^N$-PAM or DMT). However, the encoding of the non-LSB sequence may depend on the modulation utilised as described above. Also note that a PAM constellation may be used regardless of modulation scheme (e.g. PAM and DMT modulation).

Multi-Level Demodulator

Although not depicted, the present disclosure also includes a multi-level demodulator that is complementary to the multi-level modulator 600 shown in FIG. 6 and/or the multi-level modulator 900 shown in FIG. 9. The multi-level demodulator may include a demapper for demapping symbols, a first decoder block for decoding the bits that have been encoded using an inner encoder, and a second decoder block for decoding the bits that have been encoded using an outer encoder. The manner in which this is accomplished is implementation-specific.

Additional aspects are defined by the following clauses:
Clause 1. A demodulator comprising:
  a symbol demapper for demapping symbols into a bit stream; and
  a multi-level decoder comprising an inner decoder and an outer decoder for decoding only a portion of the bit stream such that an information block size of the inner decoder matches a field size of the outer decoder.
Clause 2. The demodulator of Clause 1, wherein the portion of the bit stream comprises an LSB (Least Significant Bit) sequence.
Clause 3. The demodulator of Clause 1 or Clause 2, wherein:
  the bit stream further comprises a non-LSB sequence having (N−1)-times as many bits as the LSB sequence; and
  the symbol demapper is configured for demapping the symbols from a constellation of $2^N$-PAM symbols into the bit stream, where N is an integer and is constant from symbol to symbol.
Clause 4. The demodulator of Clause 1 or Clause 2, wherein:
  the bit stream further comprises a non-LSB sequence having p-times as many bits as the LSB sequence, where p is an average number of bits per LSB; and
  the symbol demapper is configured for demapping the symbols from a constellation of $2^N$-PAM symbols into the bit stream, where N is an integer and is variable from symbol to symbol.
Clause 5. The demodulator of any one of Clause 1 to Clause 3, wherein:
  the inner decoder is a block decoder; and
  the outer decoder is an RS (Reed-Solomon) decoder.
Clause 6. A method for demodulating symbols into a bit stream, comprising:
  demapping symbols into the bit stream; and
  a multi-level decoder comprising an inner decoder and an outer decoder decoding only a portion of the bit stream such that an information block size of the inner decoder matches a field size of the outer decoder.
Clause 7. A demodulator comprising:
  a symbol demapper for demapping symbols into a bit stream, the bit stream comprising an LSB (Least Significant Bit) sequence; and
  a multi-level decoder comprising an inner decoder and an outer decoder for decoding only the LSB sequence of the bit stream.
Clause 8. The demodulator of Clause 7 wherein the inner encoder and the outer encoder are configured such that an information block size of the inner encoder matches a field size of the outer encoder.
Clause 9. A method for demodulating symbols into a bit stream, comprising:
  demapping symbols into the bit stream, the bit stream comprising an LSB (Least Significant Bit) sequence; and
  a multi-level decoder comprising an inner decoder and an outer decoder decoding only the LSB sequence of the bit stream.

Numerous modifications and variations of the present disclosure are possible in light of the above teachings. It is therefore to be understood that within the scope of the appended claims, the disclosure may be practised otherwise than as specifically described herein.

We claim:

1. A modulator comprising:
   a symbol mapper for mapping a bit stream into symbols; and
   a multi-level encoder comprising an inner encoder and an outer encoder for encoding only a portion of the bit stream such that an information block size of the inner encoder is identical to a field size of the outer encoder,
   wherein a remaining portion of the bit stream is not encoded by the multi-level encoder,
   wherein the portion of the bit stream comprises an LSB (Least Significant Bit) sequence, and
   wherein:
   the bit stream further comprises a non-LSB sequence having (N−1)-times as many bits as the LSB sequence; and
   the symbol mapper is configured for mapping the bit stream into symbols from a constellation of $2^N$-PAM (Pulse Amplitude Modulation) symbols, where N is an integer and is constant from symbol to symbol.

2. A modulator comprising:
   a symbol mapper for mapping a bit stream into symbols; and
   a multi-level encoder comprising an inner encoder and an outer encoder for encoding only a portion of the bit stream such that an information block size of the inner encoder is identical to a field size of the outer encoder,
   wherein a remaining portion of the bit stream is not encoded by the multi-level encoder,
   wherein the portion of the bit stream comprises an LSB (Least Significant Bit) sequence, and
   wherein:
   the bit stream further comprises a non-LSB sequence having p-times as many bits as the LSB sequence, where p is an average number of bits per LSB; and
   the symbol mapper is configured for mapping the bit stream into symbols from a constellation of $2^N$ symbols, where N is an integer and is variable from symbol to symbol.

3. The modulator of claim 1, wherein:
   the inner encoder is a block encoder; and
   the outer encoder is an RS (Reed-Solomon) encoder.

4. The modulator of claim 1, wherein:
   the inner encoder is a Hamming or Extended Hamming encoder; and
   the outer encoder is an RS (Reed-Solomon) encoder.

5. The modulator of claim 1, wherein:
   the inner encoder is a single-parity-check encoder; and
   the outer encoder is an RS (Reed-Solomon) encoder.

6. The modulator of claim 1, further comprising:
   a second encoder for encoding a non-LSB sequence of the bit stream.

7. The modulator of claim 6, wherein the second encoder is an RS (Reed-Solomon) encoder.

8. The modulator of claim 1, wherein the symbol mapper performs the mapping without a non-LSB sequence of the bit stream being encoded.

9. The modulator of claim 1, wherein the field size of the outer encoder is at least 9.

10. A demodulator comprising:
    a symbol demapper for demapping symbols into a bit stream; and
    a multi-level decoder comprising an inner decoder and an outer decoder for decoding only a portion of the bit stream such that an information block size of the inner decoder is identical to a field size of the outer decoder,
    wherein a remaining portion of the bit stream is not decoded by the multi-level decoder,
    wherein the portion of the bit stream comprises an LSB (Least Significant Bit) sequence, and
    wherein:
    the bit stream further comprises a non-LSB sequence having (N−1)-times as many bits as the LSB sequence; and
    the symbol demapper is configured for demapping the symbols from a constellation of $2^N$-PAM (Pulse Amplitude Modulation) symbols into the bit stream, where N is an integer and is constant from symbol to symbol.

11. A demodulator comprising:
    a symbol demapper for demapping symbols into a bit stream; and
    a multi-level decoder comprising an inner decoder and an outer decoder for decoding only a portion of the bit stream such that an information block size of the inner decoder is identical to a field size of the outer decoder,
    wherein a remaining portion of the bit stream is not decoded by the multi-level decoder,
    wherein the portion of the bit stream comprises an LSB (Least Significant Bit) sequence, and
    wherein:
    the bit stream further comprises a non-LSB sequence having p-times as many bits as the LSB sequence, where p is an average number of bits per LSB; and
    the symbol demapper is configured for demapping the symbols from a constellation of $2^N$-PAM (Pulse Amplitude Modulation) symbols into the bit stream, where N is an integer and is variable from symbol to symbol.

12. The demodulator of claim 10, wherein:
    the inner decoder is a block decoder; and
    the outer decoder is an RS (Reed-Solomon) decoder.

13. The demodulator of claim 10, wherein:
    the inner decoder is a Hamming or Extended Hamming decoder; and
    the outer decoder is an RS (Reed-Solomon) decoder.

14. The demodulator of claim 10, wherein:
    the inner decoder is a single-parity-check decoder; and
    the outer decoder is an RS (Reed-Solomon) decoder.

15. The demodulator of claim 10, further comprising:
    a second decoder for decoding a non-LSB sequence of the bit stream.

16. The demodulator of claim 15, wherein the second decoder is an RS (Reed-Solomon) decoder.

17. The demodulator of claim 10, wherein the bit stream from the symbol demapper comprises a non-LSB sequence that is not decoded.

18. The demodulator of claim 10, wherein the field size of the outer decoder is at least 9.

* * * * *